United States Patent
Bänisch et al.

(10) Patent No.: US 6,603,170 B2
(45) Date of Patent: Aug. 5, 2003

(54) INTEGRATED SEMICONDUCTOR CONFIGURATION HAVING A SEMICONDUCTOR MEMORY WITH USER PROGRAMMABLE BIT WIDTH

(75) Inventors: Andreas Bänisch, München (DE); Marco Troost, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/935,623

(22) Filed: Aug. 23, 2001

(65) Prior Publication Data

US 2002/0047167 A1 Apr. 25, 2002

(30) Foreign Application Priority Data

Aug. 23, 2000 (DE) .......................... 100 41 377

(51) Int. Cl.$^7$ ............................ H01L 29/792
(52) U.S. Cl. .................. 257/324; 257/66; 257/296; 257/379; 365/185.01; 327/51
(58) Field of Search ................ 257/66–69, 71, 257/296–313, 379–381, 903–908, 260, 261, 295, 298, 314, 324–326; 365/185.01; 327/51–52

(56) References Cited

U.S. PATENT DOCUMENTS 4,961,169 A * 10/1990 Matsumura et al. ... 365/189.12
5,862,154 A * 1/1999 Pawlowski ............... 371/40.11
6,044,024 A    3/2000 Barth et al. ............. 365/189.08

FOREIGN PATENT DOCUMENTS

| EP | 0 488 678 A2 | 6/1992 |
| EP | 0 910 091 A2 | 4/1999 |
| WO | WO 01/22423 A1 | 3/2001 |

* cited by examiner

*Primary Examiner*—Nathan J. Flynn
*Assistant Examiner*—Scott R. Wilson
(74) *Attorney, Agent, or Firm*—Laurence A. Greenberg; Werner H. Stemer; Ralph E. Locher

(57) ABSTRACT

An integrated semiconductor circuit is described and has a semiconductor memory configuration embedded in a semiconductor chip and an interface circuit. The interface circuit is set up for the connection and transfer of data and control signals between the semiconductor memory configuration and a circuit periphery surrounding the memory configuration. The interface circuit is configured as a standard interface for all types of integrated semiconductor circuits with an embedded semiconductor memory configuration for the largest bit width that can be realized in the semiconductor memory configuration. A switch configuration is provided which switches off bits of the standard interface that are unused for smaller bit widths.

5 Claims, 2 Drawing Sheets

INTEGRATED SEMICONDUCTOR CONFIGURATION HAVING A SEMICONDUCTOR MEMORY WITH USER PROGRAMMABLE BIT WIDTH

BACKGROUND OF THE INVENTION

Field of the Invention

The invention relates to an integrated semiconductor circuit with a semiconductor memory configuration embedded in a semiconductor chip and an interface circuit. The interface circuit is set up for the connection and transfer of data and control signals between the semiconductor memory configuration and a circuit periphery surrounding it and is integrated on the same semiconductor chip.

Integrated semiconductor circuits configured according to user desires (so-called ASICs) are often realized together with embedded semiconductor memory configurations around which the semiconductor circuit realized according to user specifications is then integrated on the same semiconductor chip. In this case, it often happens that different users desire semiconductor cell arrays that are different with regard to size and organization.

For this reason, an interface circuit between the semiconductor memory cell array and the circuit periphery has hitherto been realized in different embodiments in the corresponding products depending on the size and organization of the cell arrays. In this case, problems often occurred at the edge regions of the cell array. Such problems, such as geometrical errors which violated design rules, often occurred in the prior art due to an excessively narrow design, for example caused by excessively wide interconnects for the power supply.

SUMMARY OF THE INVENTION

It is accordingly an object of the invention to provide an integrated semiconductor circuit with a semiconductor memory configuration embedded in a semiconductor chip which overcomes the above-mentioned disadvantages of the prior art devices of this general type, which can avoid the problems outlined above in the edge region of the cell array and affords a cost-effective and reliable solution in cell arrays of the memory in a different size and organization essentially without any loss of area in the integration.

With the foregoing and other objects in view there is provided, in accordance with the invention, an integrated semiconductor circuit. The circuit contains a semiconductor chip, a semiconductor memory configuration embedded in the semiconductor chip, a circuit periphery embedded in the semiconductor chip and surrounds the semiconductor memory configuration, and an interface circuit disposed on the semiconductor chip. The interface circuit is set up for connecting and transferring data and control signals between the semiconductor memory configuration and the circuit periphery. The interface circuit is a standard interface for all types of integrated semiconductor circuits having the semiconductor memory configuration with a largest bit width that can be realized in the semiconductor memory configuration. The interface circuit has a switch configuration switching off bits of the interface circuit that are unused for defining smaller bit widths.

In accordance with an essential aspect of the invention, the above object is achieved by virtue of the fact that a uniform standard interface between the cell array and a column decoder or a secondary sense amplifier is realized for all circuit types with an embedded semiconductor memory configuration and for the cell arrays which differ with regard to size and organization depending on customer desires. This standard interface is configured for the largest currently feasible bit width of the semiconductor memory configuration and provides a switch configuration by which unused bits are simply switched off in order to realize smaller bit widths.

There is no loss of area since the cell array is always of the same size and only the number of column decoders and secondary sense amplifiers ever has to be adapted.

In this case, the maximum bit width that can currently be realized for a cell array of an embedded semiconductor memory configuration is 64 bits, for example.

In accordance with an added feature of the invention, a column decoder is provided. The semiconductor memory configuration has a cell array and the interface circuit is connected between the cell array and the column decoder.

In accordance with an additional feature of the invention, a secondary sense amplifier is provided. The semiconductor memory configuration has a cell array and the interface circuit is connected between the cell array and the secondary sense amplifier.

In accordance with a further feature of the invention, there is provided a plurality of column decoders and a plurality of secondary sense amplifies connected between the interface circuit and the column decoders. The number of the column decoders and the number of the secondary sense amplifiers are adapted to a respective bit width desired.

Other features which are considered as characteristic for the invention are set forth in the appended claims.

Although the invention is illustrated and described herein as embodied in an integrated semiconductor circuit with a semiconductor memory configuration embedded in a semiconductor chip, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
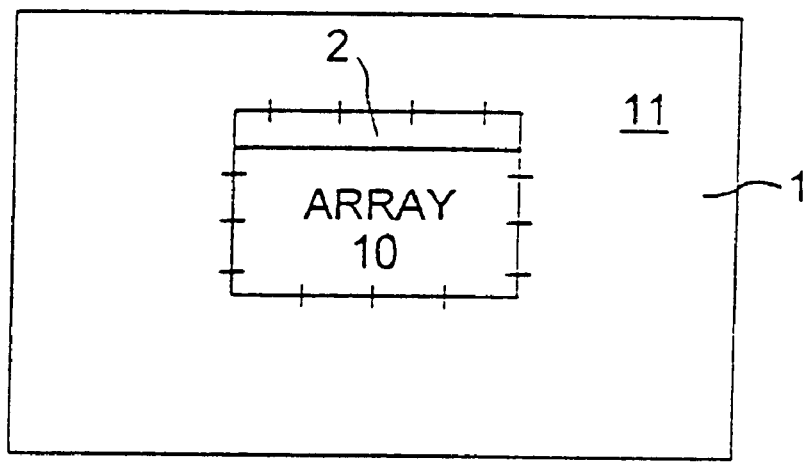
FIG. 1 is a block diagram of a semiconductor circuit with an embedded semiconductor memory configuration integrated on a semiconductor chip according to the invention.

In all the figures of the drawing, sub-features and integral parts that correspond to one another bear the same reference symbol in each case. Referring now to the figures of the drawing in detail and first, particularly, to FIG. 1 thereof, there is shown a semiconductor circuit integrated in a semiconductor chip 1 that has an embedded semiconductor memory configuration or a memory array 10 with an interface circuit 2 for the connection and transfer of data and control signals (not shown) between the semiconductor memory configuration 10 and a circuit periphery 11 that surrounds it and is integrated on the same chip 1.

As mentioned, the memory array 10 may have cell arrays that differ with regard to size and organization depending on user desires.

Figure 2:
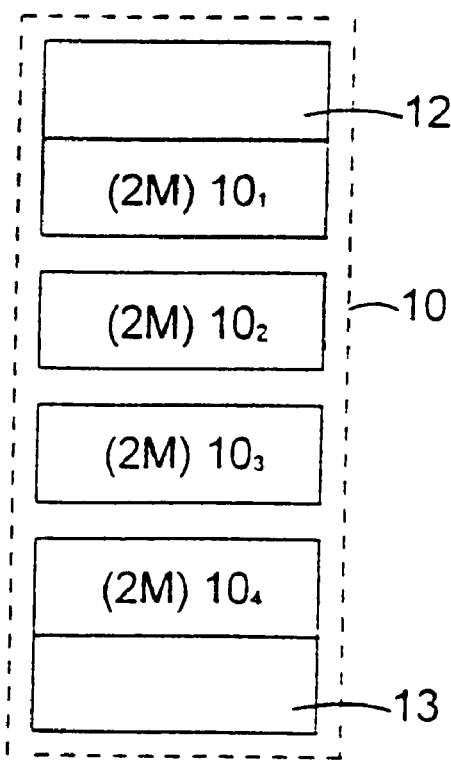
FIG. 2 is a block diagram showing the embedded semiconductor memory configuration in accordance with FIG. 1 with four 2M cell arrays.

The memory array 10 in FIG. 2 contains, by way of example, four 2 Mbit cell arrays $10_1$, $10_2$, $10_3$ and $10_4$ with a generator block 12 and a secondary sense amplifier and decoding logic block 13.

Figure 3:
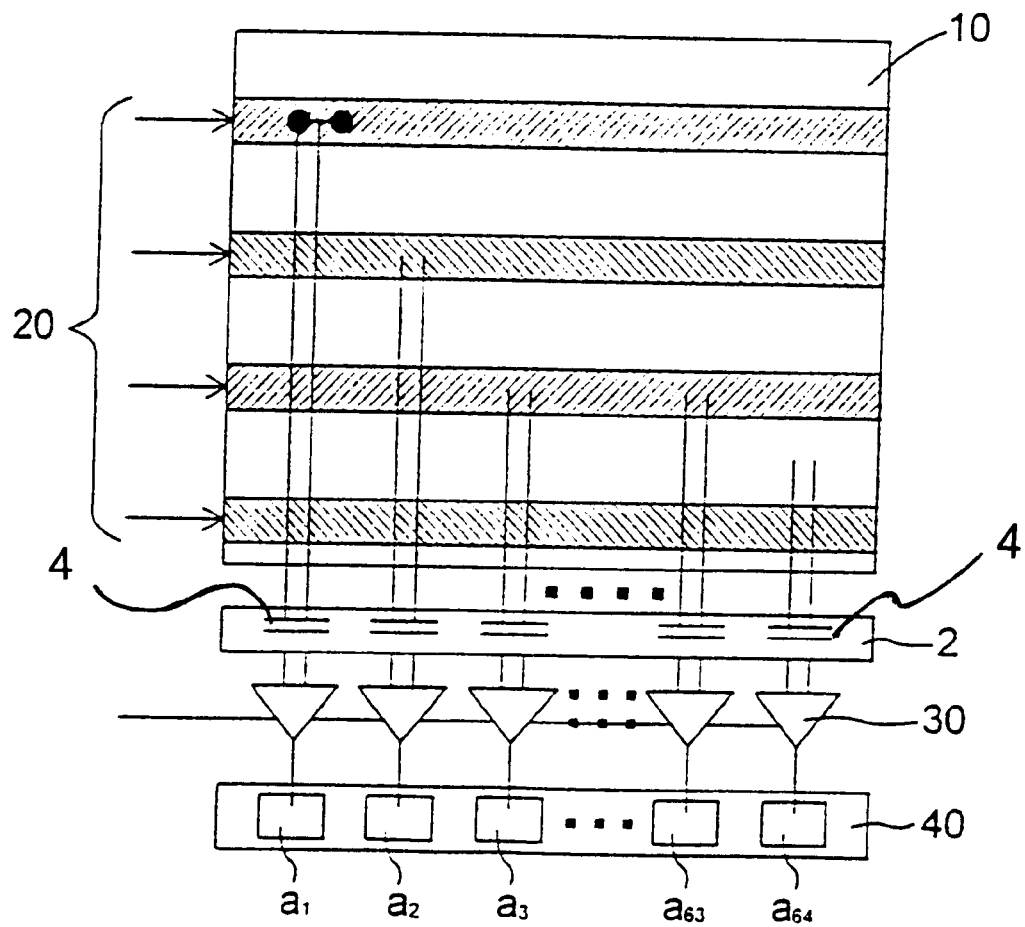
FIG. 3 is an illustration of an exemplary embodiment of the semiconductor memory configuration embedded in the semiconductor circuit with a standard interface according to the invention.

In FIG. 3, only primary sense amplifiers 20 of a cell array of the embedded semiconductor memory configuration 10 in accordance with FIG. 2 are indicated by hatched rows. Sense lines lead from the primary sense amplifiers 20 via the interface circuit 2, embodied as a standard interface according to the invention, to secondary sense amplifiers 30, which amplify the data read from the semiconductor memory configuration 10 and feed them down to a column decoder 40, which contains 64 read data output pads A1–A64 in the example illustrated in FIG. 3.

According to the invention, the standard interface 2 is configured for the largest bit width, 64 bits in the example, of the embedded semiconductor memory configuration 10. The standard interface 2 has a switch configuration formed of a plurality of switches 4 by which unused bits are switched off, if a lower bit width of the semiconductor memory configuration 10 is intended to be realized.

Consequently, the cell array or the semiconductor memory configuration 10 is always of the same size and, by virtue of the realization of the standard interface 2 with the largest bit width, only the number of column decoders A1–A64 in the decoder block 40 and the number of secondary sense amplifiers in the amplifier block 30 need be adapted.

Complicated adaptation work that possibly causes geometry errors at the edge regions of the cell array is thus avoided.

Consequently, all types of integrated semiconductor circuits provided with an embedded semiconductor memory configuration can be integrated with a uniform standard interface between cell array and column decoder or secondary sense amplifier.

We claim:

1. An integrated semiconductor circuit, comprising:
    a semiconductor chip;
    a semiconductor memory configuration having different bit widths embedded in said semiconductor chip;
    a circuit periphery embedded in said semiconductor chip and surrounding said semiconductor memory configuration; and
    an interface circuit disposed on said semiconductor chip for connecting and transferring data and control signals between said semiconductor memory configuration and said circuit periphery, said interface circuit being a standard and identical interface for all types of integrated semiconductor circuits having said semiconductor memory configuration, said standard interface configured for interfacing with a largest bit width to be realized in said semiconductor memory configuration, said interface circuit having a switch configuration switching off unused bits of said interface circuit for defining smaller bit widths.

2. The integrated semiconductor circuit according to claim 1, including a column decoder, said semiconductor memory configuration having a cell array and said interface circuit is connected between said cell array and said column decoder.

3. The integrated semiconductor circuit according to claim 1, including a secondary sense amplifier, said semiconductor memory configuration having a cell array and said interface circuit is connected between said cell array and said secondary sense amplifier.

4. The integrated semiconductor circuit according to claim 1, including:
    a plurality of column decoders; and
    a plurality of secondary sense amplifies connected between said interface circuit and said column decoders, a number of said column decoders and a number of said secondary sense amplifiers are adapted to a respective bit width desired.

5. The integrated semiconductor circuit according to claim 1, wherein said largest bit width is 64.

* * * * *